(12) United States Patent
Muschaweck

(10) Patent No.: US 9,405,861 B2
(45) Date of Patent: Aug. 2, 2016

(54) METHOD OF MODELING AN ILLUMINATION DEVICE

(75) Inventor: Julius Muschaweck, Gauting (DE)

(73) Assignee: OSRAM GmbH, Munich (DE)

(*) Notice: Subject to any disclaimer, the term of this patent is extended or adjusted under 35 U.S.C. 154(b) by 547 days.

(21) Appl. No.: 13/818,591

(22) PCT Filed: Aug. 24, 2010

(86) PCT No.: PCT/EP2010/062333
§ 371 (c)(1),
(2), (4) Date: Apr. 29, 2013

(87) PCT Pub. No.: WO2012/025145
PCT Pub. Date: Mar. 1, 2012

(65) Prior Publication Data
US 2013/0211794 A1 Aug. 15, 2013

(51) Int. Cl.
*G06F 17/50* (2006.01)
*G02B 27/00* (2006.01)
*G06T 15/50* (2011.01)

(52) U.S. Cl.
CPC ............ *G06F 17/50* (2013.01); *G02B 27/0012* (2013.01); *G06T 15/50* (2013.01); *G06F 17/5009* (2013.01)

(58) Field of Classification Search
None
See application file for complete search history.

(56) References Cited

U.S. PATENT DOCUMENTS

| 8,757,849 B2* | 6/2014 | Brick et al. | 362/333 |
| 2004/0070855 A1* | 4/2004 | Benitez et al. | 359/858 |
| 2006/0139575 A1* | 6/2006 | Alasaarela et al. | 353/31 |
| 2006/0203468 A1* | 9/2006 | Beeson et al. | 362/84 |
| 2008/0121912 A1* | 5/2008 | McKenzie et al. | 257/98 |
| 2012/0294037 A1* | 11/2012 | Holman et al. | 362/609 |

OTHER PUBLICATIONS

Schweyen et al. Geometrical Optical Modeling Considerations for LCD Projector Display Systems SPIE vol. 3013, 1997.*
Fournier Design Methodology for High Brightness Projectors Journal of Display Technology, vol. 5, No. 1, Mar. 2008.*
Peng et al. A High Power Light Emitting Diode Module for Projection Display Application 11th International Conference on Electronic Packing Technology & High Density Packaging, IEEE, 2010.*
F. Fournier et al., "Design Methodology for High Brightness Projectors", Journal of Display Technology, vol. 4, No. 1, Mar. 1, 2008.

(Continued)

*Primary Examiner* — Omar Fernandez Rivas
*Assistant Examiner* — Cuong Luu
(74) *Attorney, Agent, or Firm* — Cozen O'Connor

(57) ABSTRACT

This invention relates to a method of designing an illumination device, wherein a light source unit is modeled with a set of rays. Therein, each ray is assigned a light power and is further characterized by a light volume, which specifies how "spread out" the light is in area and angle. In this way, a selection of rays with respect to their "density" becomes possible, and an optical system can be optimized for a transmission of those rays providing the most light per volume.

9 Claims, 8 Drawing Sheets

(56) References Cited

OTHER PUBLICATIONS

P. Chenhui et al., "A high power light emitting diode module for projection display application", 11$^{th}$ International Conference on Electronic Packaging Technology & High Density Packaging, pp. 1412-1416, Aug. 16, 2010.

Optical Research Associates: "Light Tools, Modeling Sources in Light Tools", Jun. 2009, http://www.cadfamily.com/download/Optical/Lighttools Optimization/SourceModeling.pdf.

* cited by examiner

METHOD OF MODELING AN ILLUMINATION DEVICE

RELATED APPLICATIONS

This is a U.S. national stage of application No. PCT/EP2010/062333, filed on Aug. 24, 2010.

FIELD OF THE INVENTION

This invention relates to a method of modeling an illumination device, wherein a light source unit is modeled with a set of rays.

BACKGROUND OF THE INVENTION

Optical systems in applications from display lighting and projection systems to automotive or medical lighting are subject to a virtual prototyping during a first design phase. Further, respective design tools also allow a continuous improvement during a product cycle. The tools used therein apply a ray tracing technique, with which a propagation of individual light rays through a virtual optical system can be calculated. A virtual model of the optical system can for example be imported from a lens design or CAD program or be generated by the ray tracing program itself.

The data on the light source is provided as a set of rays, wherein each ray is characterized by a starting point, a direction, and a light power, which is typically weighted by a spectral sensitivity of the human eye and indicated as luminous flux. In addition, there may be information on color for each ray, for instance in the form of a wavelength or tristimulus values. Then, the rays are traced through the optical system, and the transmission properties of the system can subsequently be derived by summing up the luminous flux of rays passing through to an exit aperture. Maximizing the transmission requires a plurality of such tracing steps, each performed with a slightly modified virtual model. Thus, an optimization is time-consuming and costly.

One object of the invention is to provide an improved method of modeling an illumination device.

SUMMARY OF THE INVENTION

This and other objects are attained in accordance with one aspect of the present invention directed to problem is solved with a method comprising modeling a light source unit with a set of rays, wherein rays are at least characterized by a light power, and an etendue, for providing information on a light power per etendue of said light source.

The etendue, which is defined as a sum of infinitesimal surface elements, multiplied respectively with an associated projected solid angle and with the square of the refractive index, characterizes how "spread out" the light is in area and angle. It is a 4-dimensional quantity, which is referred to as light "volume" (a phase space volume) for the purpose of illustration. In this context, the light emitted by the source is, according to this invention, initially characterized by the volume it fills.

Further, the distribution of the light power with regard to the volume (etendue) specifies how this volume is filled up by the source. An analogy hereto is a 3-dimensional volume being filled with a mass. Often, a light source will not emit light homogeneously distributed, but dependent on a direction. Thus, the light volume can also be filled inhomogeneously, which means that different rays will have a different light power per etendue, namely a different light density in the sense of light per volume. Coming back to the analogy, each model ray describes a sub-volume and is assigned a mass, the rays can have a different density.

In contrast, state of the art light source modeling provides only information on the light power, thus, only on a mass to stay with the analogy. Since there is no information provided on the volume filled by a ray, later on selecting for example those rays having the greatest light power will not necessarily maximize the light power put through an optical system—the volume filled by a ray can be large, namely its density low.

By contrast, providing this information according to the invention allows identifying those rays in the set, which fill a light volume particularly or even most efficiently, namely densely.

In this way, an information on how a specific light source fills up its light volume can for example be provided by a manufacturer of the light source to an optical designer, for instance to a manufacturer of a projection system, and allows an optimization of the transmission properties.

The information can for example be provided in a data array, each ray assigned a line and its values provided in columns or vice versa. Therein, the information on the etendue does not necessarily have to be provided as a value being explicitly displayed with a ray, but can also be assigned implicitly. This can for instance be the case if rays are generated, which have an identical etendue each. Then, a comparison with respect to density is also possible by comparing only the light power, because an identical light volume can be omitted anyway. In this context, "characterized by a light power and an etendue" can mean that one of the light power and etendue values is explicitly known for a ray and the other one has a predetermined value or a defined relationship to the other rays and is implicitly known, thus.

Referring to the analogy again, the information on the density is also provided if either the sub-volumes or the masses are identical—the greatest mass or the smallest sub-volume will result in the greatest density.

Further, the information on the light power can for example also be provided in terms of equivalent radiometric or photometric quantities having a defined relation to the light power, for instance as irradiance, radiant intensity, illuminance, or luminous intensity. The etendue can analogously be obtained by the respective surface area and/or the projected solid angle (for detail, reference is made to FIG. 7)—.

A starting point and a direction, which further characterize a ray, can for example be provided as Cartesian coordinates, for instance three values for the starting point and three values for the direction in a 3-dimensional space. Alternatively, for example a reference surface can be defined, on which two coordinates indicate the starting point. The corresponding direction can then be indicated by two angles with respect to a surface normal and a tangent direction at the starting point.

Depending on a specific application, the spectral range of the light source is not restricted to the visible light, but can comprise infrared and ultraviolet light.

Preferred embodiments appear from the dependent claims and the following description, wherein the details refer to all aspects of the invention and are meant as being disclosed individually.

Further, the invention is not restricted to a method, but also disclosed in terms of a computer program product and a respective use of it.

According to a first embodiment, the information on the light power and etendue is provided as a radiant flux and a radiance or as a luminous flux and a luminance. The luminous flux is a radiant flux weighted with a spectral sensitivity of the human eye. The luminance can be defined as the luminous flux per etendue, and the radiance as radiant flux per etendue. Thus, a ray will be assigned a luminance in addition to the luminous flux, namely a density in addition to a mass in the analogy. The information on the sub-volume (etendue) of a ray is contained in its density together with the mass.

In a further aspect of the invention, information on the light power and the etendue is derived by physically modeling the light source. In case of a gas discharge lamp for instance, the temperature distribution of the gas discharge can be obtained in a first step by a finite element analysis. This gives a power density per volume and results, together with parameters as for example a pressure, in a luminance distribution of the gas discharge lamp.

Therein, the number of rays in the set can either be adapted to a discretization of the source modeling or be chosen independent from it, for instance after calculating support values.

In another preferred embodiment, the information on the light power and the etendue is derived from a number of imaging measurements. Preferably, a surface of the light source or a shell around the light source is imaged at least partially with a camera, which can be pivotally mounted in a goniometer. Any such luminance measurement results in a 4-dimensional data field, wherein image coordinates can be transferred to spatial directions, if the properties of the optical imaging and the camera positions are known.

Then, a ray data set can for example be obtained by multiplying a luminance value of a picture element with a corresponding solid angle, which gives the luminous flux. By assigning both to a ray, the luminance and the luminous flux, the ray is characterized by light power and etendue.

The invention also relates to designing an illumination device, wherein a light source is modeled as described above.

The illumination device can comprise imaging and nonimaging optical elements and for example be a part of an optical device, as for instance a video projector, or intended for the illumination to a final application, for instance as a lighting in a room or of a vehicle.

In particular, an aspect of the invention relates to designing an illumination device with an optical system for transmitting light from the light source to a further use, for instance to a projection plane. An optical system can be characterized by its etendue, which is a device dependent value and specifies the light volume "fitting through" the optical system. In imaging optics for instance, the etendue of an imaging system is often called "throughput" accordingly.

In a preferred embodiment, the etendue of an optical system is determined and compared with an etendue sum of a plurality of rays (theoretically at least one ray).

In the context of the analogy, the source (light source) and the target (optical system) have each a volume, wherein the latter is typically smaller. According to the invention, the source is described with small sub-volumes, which can be compared with the target volume in a sum together with other sub-volumes.

Often, a light source can only be properly described with a large number of rays, for example with more than $10^3$, $10^4$, $10^5$, or $10^s$ rays. Therefore, a plurality of rays will typically fit through, provided an appropriate distribution of the source etendue to the individual rays. Therein, individual rays exceeding the etendue of the optical system can for example indicate an irregularity of the ray model chosen.

Typically, a plurality of rays will fill the etendue of the optical system together. By comparing now a sum of etendue values, the number of rays fitting through the system at a maximum can for instance be derived. This can, on the one hand, be an absolute number if the rays have identical etendue values. If not, on the other hand, the number of rays fitting through can also vary in dependence of a specific manner of choosing the rays to be added.

In a preferred embodiment, the ray choice for the etendue sum is derived by respectively adding a ray, which has a larger light power per etendue than (at least 80%, preferably 90%, further preferred 95%, of) those rays, which have not yet been considered in the etendue sum. In this way, the rays providing the most light power per volume, namely the greatest density, are considered in the sum. Selecting always those rays, until a limiting etendue is reached, will automatically maximize the transmitted light power.

Coming back to the analogy, adding only the respectively densest sub-volume, until a source volume is filled, automatically maximizes the mass in the source volume.

The light power per etendue can also be displayed graphically for a plurality of rays, preferably for all rays. Therein, the etendue can for example be shown on one axis of a 2- or 3-dimensional plot, wherein an etendue value of a ray can be respectively added to an etendue sum of the preceding rays. In this way, the etendue values are arranged side by side as intervals adjacent to each other.

The data can for example be presented in a line or scattered plot or in a bar chart. The respective data can be transferred from a processing or storage unit to an output unit, for example a monitor or a plotter.

In a further embodiment, the light power transmitted by the optical system can be maximized by choosing rays having a density greater than or equal to a marginal density.

The marginal density (light power per etendue) can for example be obtained by an algorithm comparing an above-mentioned etendue sum with the etendue of the optical system, wherein the last ray fitting into the etendue of the optical system delivers the marginal density if always that ray having the greatest light power per etendue is added.

According to a further embodiment, a sub-set of rays is obtained by selecting rays from the set in such a way that an etendue sum of the selected rays does not exceed an etendue of an optical system by more than 20%, preferably 10%. In this way, an optical system having improved transmission properties can be designed, even though not all rays will fit through later on. Further preferred, the etendue sum is somewhat smaller than or equal to the etendue of the optical system.

A respective sub-set can, also in dependence of the etendue of the optical system, contain a significantly smaller number of rays, even by orders of magnitude. Together with one of the above-mentioned selection techniques, selecting for example rays having a density exceeding the marginal density, a sub-set can be obtained, which ensures a maximized throughput of light power.

Then, a further aspect of the invention relates to deriving an optimized setup of the light source unit and the optical system. For this purpose, the sub-set can for example be fed to a ray tracing program as an effective light source. The number of rays transmitted by the optical system can then be maximized during subsequent iteration cycles, wherein for instance geometric properties can be altered, for example an angular orientation between light source and optical system or a reflector geometry.

Due to the reduced number of rays in the sub-set, this optimization will be less time-consuming than with a full set of rays.

Preferably, the optimization is carried out with a selection of rays of the sub-set, which have a smaller light power per etendue than at least 20%, increasingly preferred 30%, 40%, 50%, 60%, 70%, 80%, 90%, 95%, 99% of the rays of the sub-set, i.e. approximated marginal rays. In this way, the number of rays can be further decreased, and calculation time is reduced. Advantageously, a set thus selected from the subset can for instance be smaller by orders of magnitude.

A setup being optimized for a transmission of those "small density" marginal rays of the sub-set will also maximize the transmission of the other rays, namely the rays having the greatest light power per etendue. Referring to the analogy again, a set of sub-volumes will be contained in a target volume if a transmission of a 2-dimensional shell around the sub-volumes to the target volume is assured (see also FIGS. 5 and 6).

Those rays assuring a transmission are also referred to as "edge rays" and would, if for illustration the concept was applied to the original ray data set and not to the sub-set, have a light power per etendue ratio almost equal to zero, as a majority of the sub-volumes would only be filled with a low light power.

A set of edge rays can, in case of a light source, which has a (e.g. rotational) symmetry or can be approximated in such a way, be further reduced. In this case, the above mentioned 2-dimensional shell (in the analogy) can be fully described with a 1-dimensional line, which corresponds a 2-dimensional sub-space of the etendue.

The invention also relates to manufacturing an illumination device, wherein a respective method of designing or modeling is applied, for instance in the course of a virtual prototyping.

The invention further relates to a computer program product, namely to an algorithm for carrying out a method as described above, for instance program means for selecting rays in dependence of an etendue of an optical system. The computer program product can be provided on a storage medium being accessible by computer means, for instance optically, on a CD-ROM or DVD, or electronically, on a semiconductor memory or a hard disk drive.

According to a further embodiment, a respective computer program product is provided together with a ray data set according to this invention.

A light source can for example be characterized by a luminance measurement, either in-house or by an external provider, and can then be modeled with a ray data set, for instance by a computer program product according to the invention. Then, the respective data is stored and can be provided to a customer, for example together with a computer program product for designing.

Since a respective computer program product or ray data set contains the relevant information on the light source, the optical designer can start his developments, even if the light source itself has not been presented, for instance is still a prototype. In this way, an overall development duration of for example a consumer product can be reduced.

Further, a ray data set can also be provided together with program means for carrying out a method of designing an illumination device.

In a further embodiment, the invention relates to using such a computer program product for selecting rays for a further use in an illumination device by comparing rays with respect to etendue and/or light power.

PREFERRED EMBODIMENTS OF THE INVENTION

Figure 1:
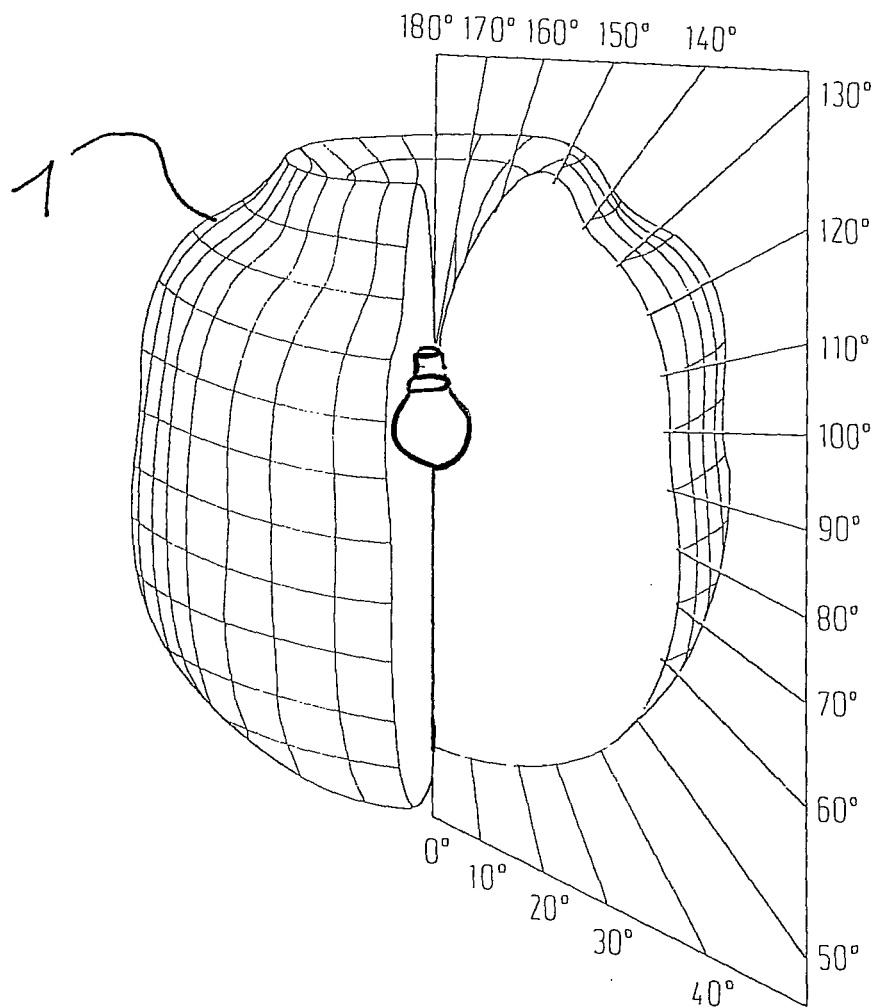
FIG. 1 shows a luminous intensity distribution of a light bulb.

FIG. 1 shows a 3-dimensional view of a spatial distribution 1 of a luminous intensity of a light bulb. The light bulb emits a luminous flux, which is a radiated power weighted by a spectral sensitivity of the human eye. In general, a light source does not emit the luminous flux homogenously distributed to the space, but varying in dependence of a direction. Therein, the luminous intensity specifies the luminous flux being emitted into a certain solid angle range and provides a far-field characterization of the (point-like) light-source.

The luminous intensity distribution 1 in FIG. 1 illustrates the luminous flux being shielded by the socket of the light bulb from about 160° upward. In contrast, the luminous intensity reaches maximum values in the opposite direction, towards 0°.

For designing an optical system having for example a lens and a reflector, a light source can be modeled with a ray data set, which comprises a plurality of individual rays, each being characterized by a starting point, a direction, and a luminous flux. Therein, three coordinates characterize the starting point of a ray (x, y, z) and its direction (kx, ky, kz), respectively.

Figure 2:
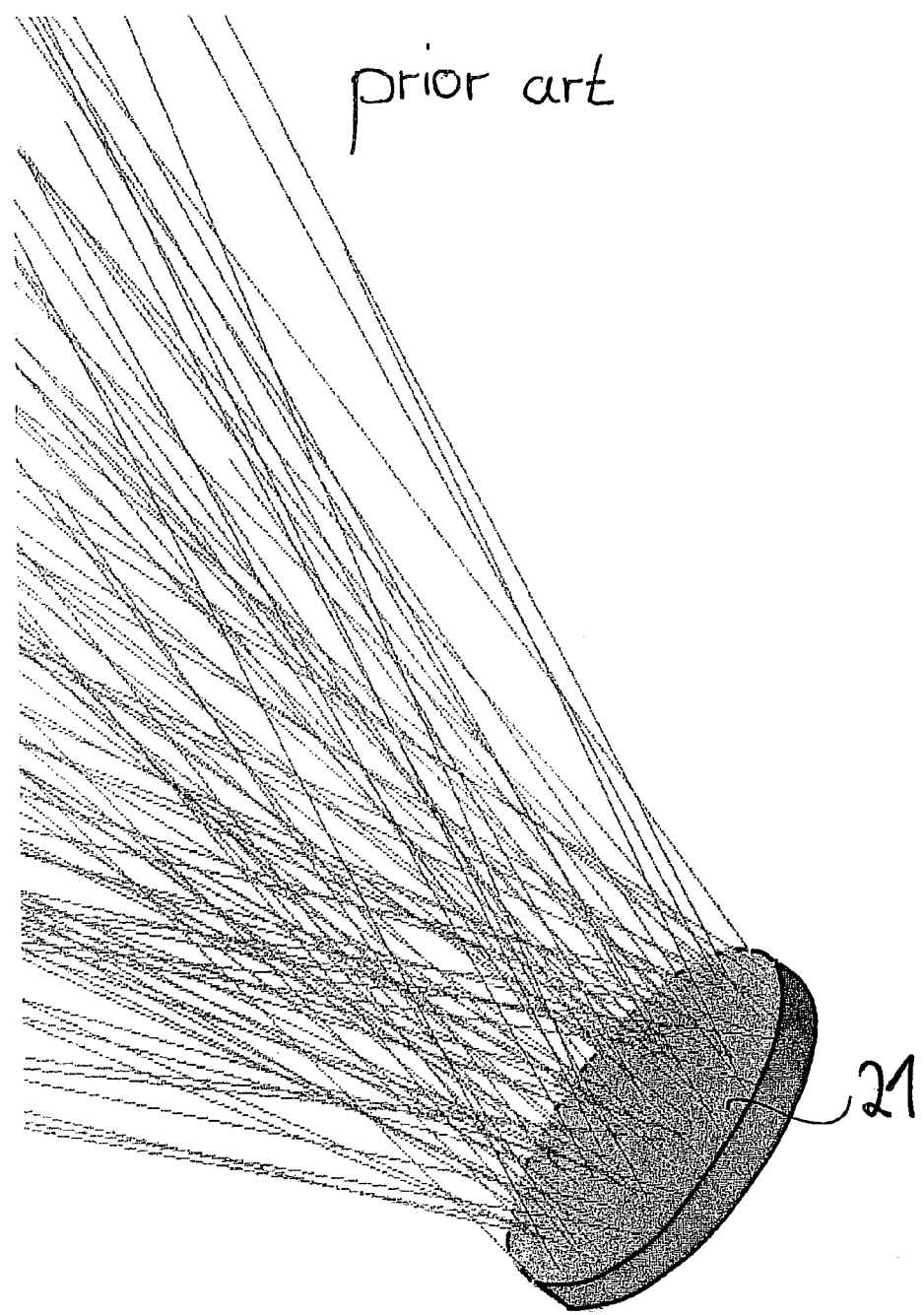
FIG. 2 shows a state of the art ray data set.

FIG. 2 shows a state of the art ray data set for a source 21, which can for example be generated by a manufacturer of the light source and be provided to an optical designer for virtual prototyping. Therein, optical elements as a lens or a reflector are arranged with a certain distance and orientation to the virtual light source. Then, the rays are traced through the virtual optical system, wherein the transmitted luminous flux can be derived by summing up the luminous flux of the transmitted rays. For an optimization, the position of the optical elements is varied in subsequent iteration cycles.

However, there is no information provided on the etendue of a ray, and therefore neither on the solid angle it fills nor on the surface area it originates from. Each ray delivers only an information on a single point of the source and contains no information on its "neighborhood"—selecting for examples rays having neighboring starting points will result in an arbitrarily shaped light bundle, as the rays have arbitrarily distributed directions to each other. Thus, a transmission of those rays through an optical system with limited etendue cannot be assured. This, although the light power has not even been considered yet.

The present state of the art does not indicate a solution for deciding in advance, which rays to pick if the etendue of an associated optical system is limited.

Figure 3:
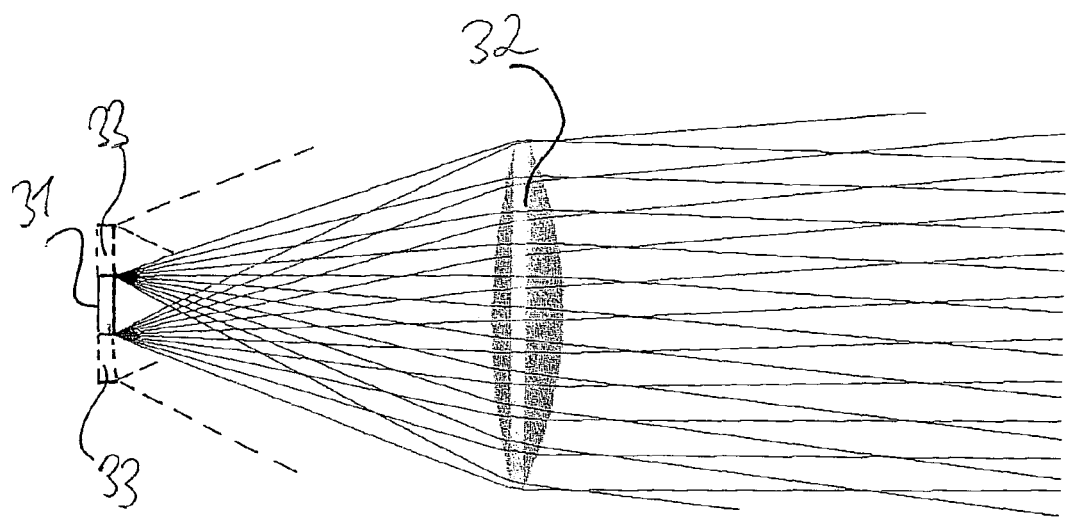
FIG. 3 illustrates a conservation of etendue in an optical system.

Therein, the etendue of the light does not change during the propagation through the system, particularly it cannot be decreased, which is illustrated in FIG. 3. The solid angle of the beam can only be decreased by increasing its cross-sectional area from a source 31 to a lens 32. Therein, the etendue remains unchanged, which means in other words that a given source 31 area limits the collimation and a given solid angle predetermines a minimal area.

In optical design, the etendue of an optical system or a lens is often smaller than the etendue of a source 31. This problem is illustrated in FIG. 3 with additional source elements 33 emitting also light with a certain solid angle. The surface of the source 31/33 is smaller than the surface of the lens 34. Nevertheless, the etendue of the source 31/33 exceeds that of the lens 32 and its given angular output range due to a larger solid angle. Thus, only a part of the light emitted by the source 31/33 "fits" through the lens 32 into the given angular output range.

For illustration, the source shall have an etendue of 100 $mm^2 sr$ and the lens an etendue of 20 $mm^2 sr$ such that 80% of the source etendue, namely 80% of the "light volume" do not fit through the lens 32 and cannot be provided to an application, for example a projection plane.

The requirements regarding image contrast and brightness are increasing, and it is desirable to maximize the light yield. Therefore, the problem the inventor has faced is to select that portion of the source etendue, which maximizes the transmission of light.

Figure 4:
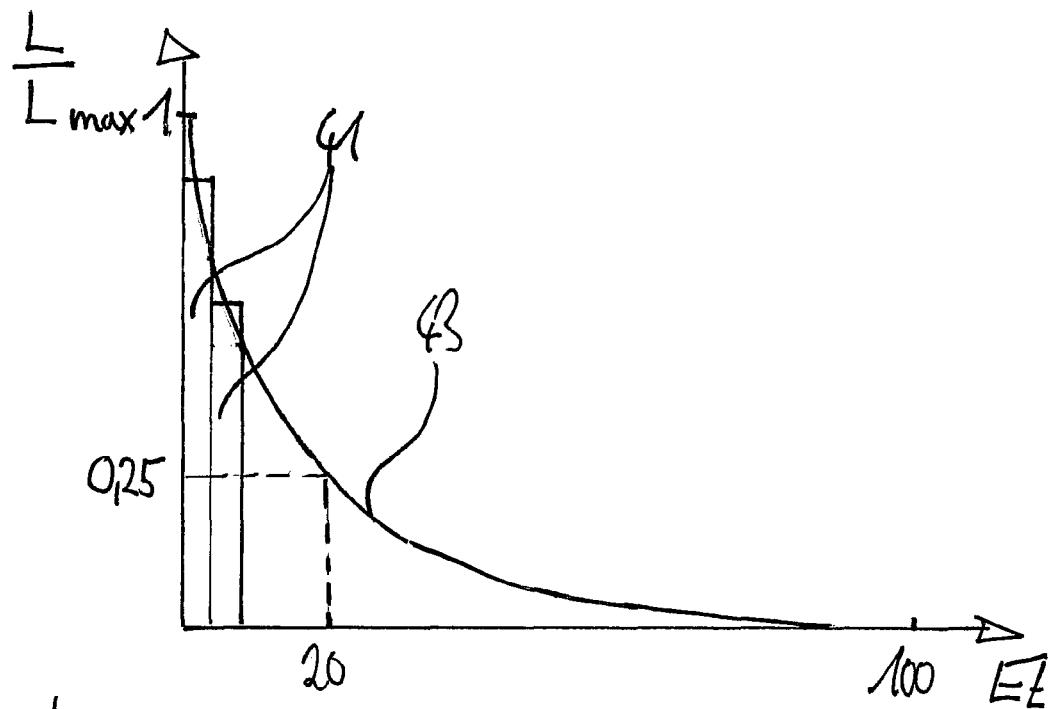
FIG. 4 illustrates a selection of rays with respect to their luminance and etendue.
Figure 4:
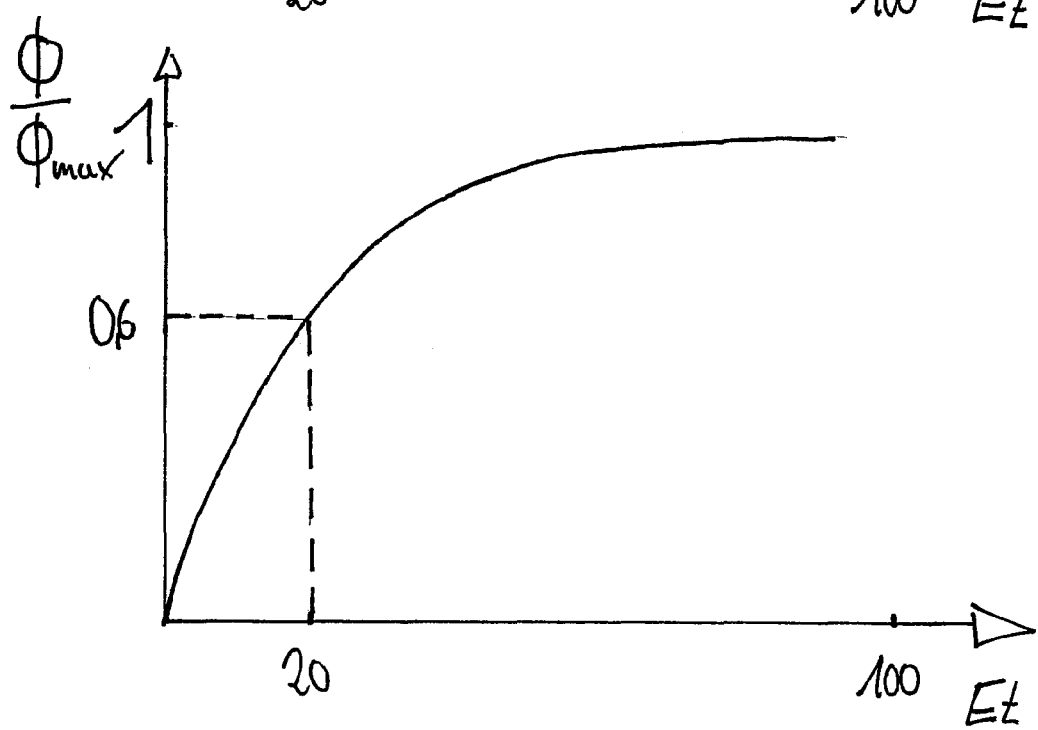

According to the invention, the source is modeled with a set of rays, wherein each ray is assigned a luminance in addition to the luminous flux. In this way, the rays can be sorted according to their luminance, beginning with the highest values. In FIG. 4, two luminance (L) values 41 are drawn, which correspond to two model rays. Depending on the application, the discretization can for example actually result in $10^4$ to $10^7$ rays such that the shape of a luminance curve 43 can be well approximated.

In this view, a normalized luminance is plotted over the etendue (Et). Since the lens has an etendue of 20 $mm^2 sr$, it can initially be derived that an optimal design maximizing the yield has to consider those rays, which have a luminance of at least 25% of the maximum luminance.

In the lower graph, a normalized luminous flux ($\Phi$) is shown, which can either be derived from an integration of the luminance or be read directly from the ray data set. This graph shows that for the optimal design, considering only rays with at least 25% of the maximum luminance, around 60% of the luminous flux of the source 5 are contained in the 20 $mm^2 sr$ etendue.

Figure 5:
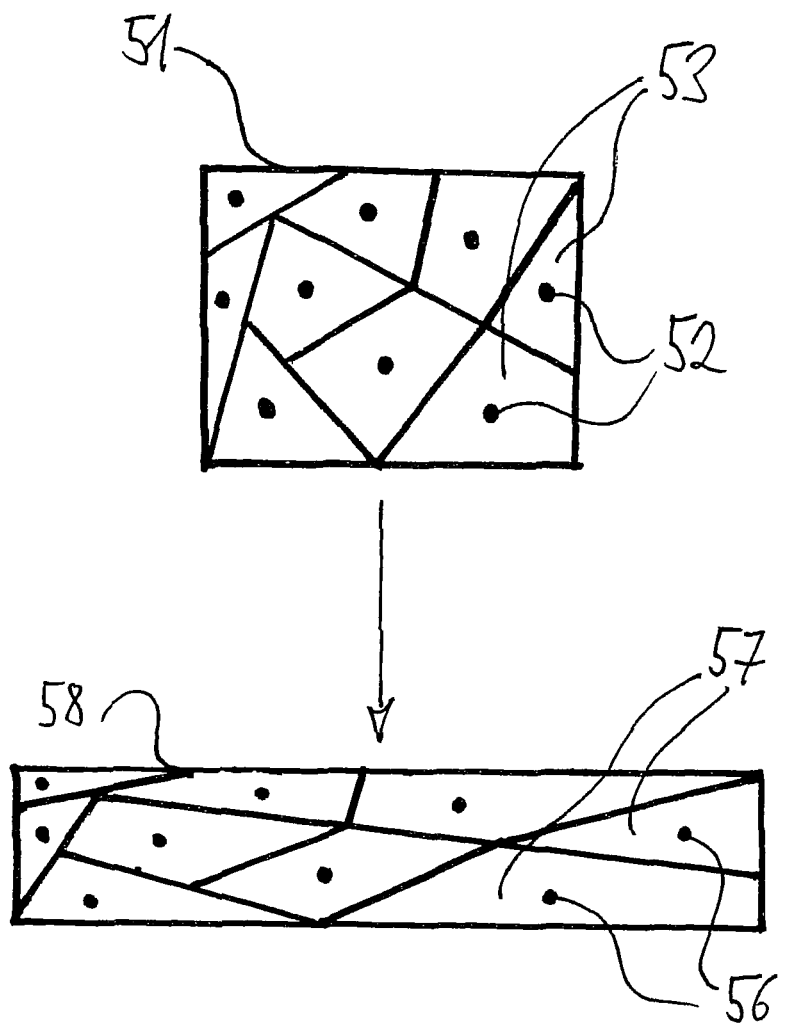
FIG. 5 schematically shows the etendue of set of rays propagating through an optical system.

FIG. 5 shows the etendue of a set of rays emitted by a source and propagating through an optical system schematically. The light is emitted from a certain surface area of the source into a certain solid angle, thus it has a certain etendue. This 4-dimensional volume is represented by the rectangle 51 in the upper part of the image. A ray is a point 52 in the 4-dimensional space, and all rays 52 are located within the etendue 51 of the source (outside of it, rays would have a luminous flux of zero). Each ray 52 is surrounded by a (4-dimensional) sub-etendue 53, wherein all sub-etendues 53 are disjoint and fill up the source etendue 51 together.

According to the invention, each ray is assigned a luminous flux and a luminance such that a respective ray-etendue 53 can be obtained by dividing the luminous flux by the luminance. In other words, knowing the "weight" (luminance flux) and the "density" (luminance) assigned to a ray allows calculating its "volume" (etendue).

In the lower part of the image, the same bundle of rays 56 is shown after a propagation through a lens (as shown in FIG. 3). Therein, the shape of the ray-etendues 57 changes, however, their (4-dimensional) volume is conserved. Further, the ray-etendues 57 remain disjoint. After passing the lens, the etendue 61 is identical to the etendue 51 before (as long as the etendue of the lens is not smaller than that of the source). The luminous flux of a ray does not change during propagation through the system (disregarding reflection and absorption losses) so that the conservation of the sub-etendue 53/57 results in a conservation of the luminance.

Figure 6:
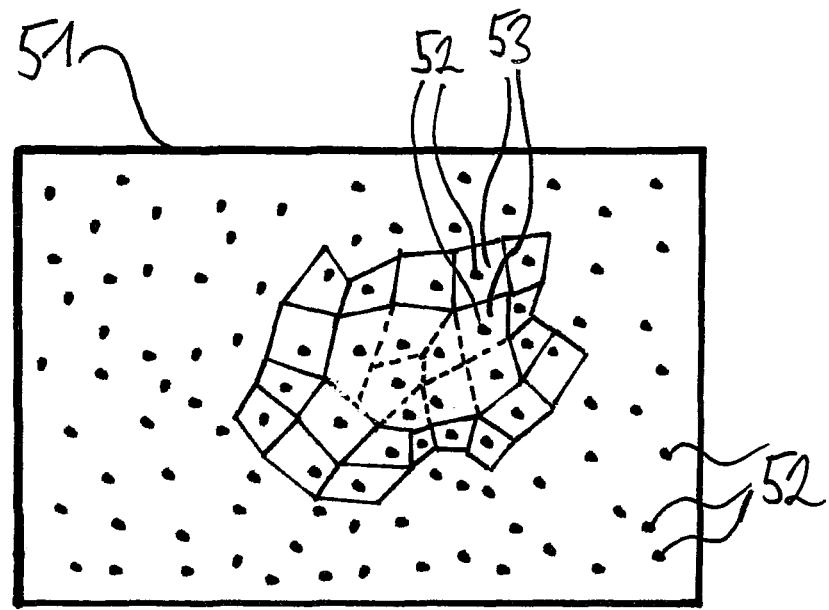
FIG. 6 illustrates rays fulfilling a marginal density criterion.

FIG. 6 schematically shows a source etendue 51, wherein a variety of rays 52 is drawn. In this case, the sub-etendue 53 is only shown for those rays 52, which fulfill the luminance requirement explained with FIG. 7, thus have a luminance of at least 25% of the maximum luminance. As a consequence, summing up the ray-etendues 52 will deliver an etendue, which, on the one hand, corresponds to the etendue of the lens, namely "fits" through the optical system. On the other hand, considering those rays for further use maximizes the luminance transmitted through the system.

Theoretically, rays fulfilling the luminance-criterion could be located arbitrarily distributed in the etendue 51. However, the inventor found that they are adjacent to each other for most light sources, as a physical light source does typically not consist of isolated peaks of high luminance but has a continuous luminance distribution.

Figure 7:
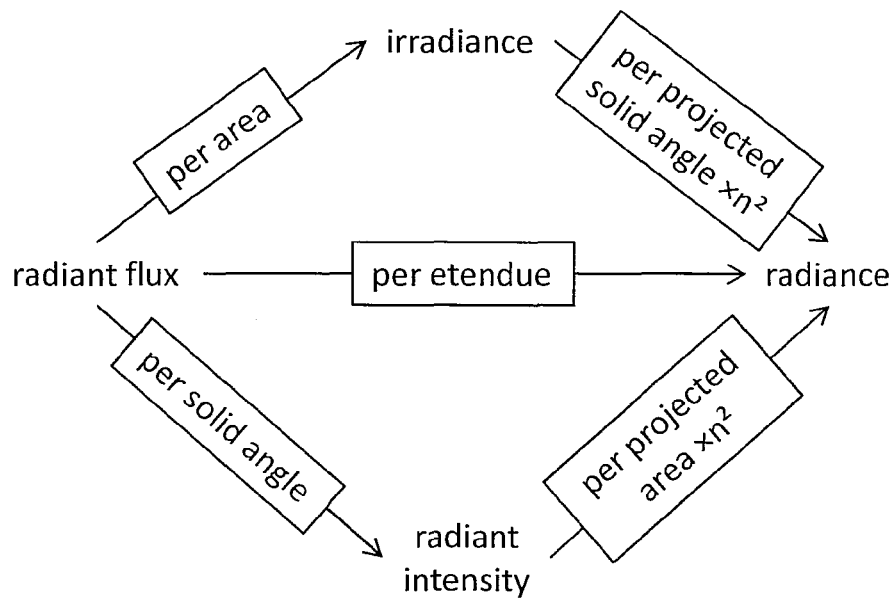
FIG. 7 shows a correlation of different radiometric and photometric measures.
Figure 7:
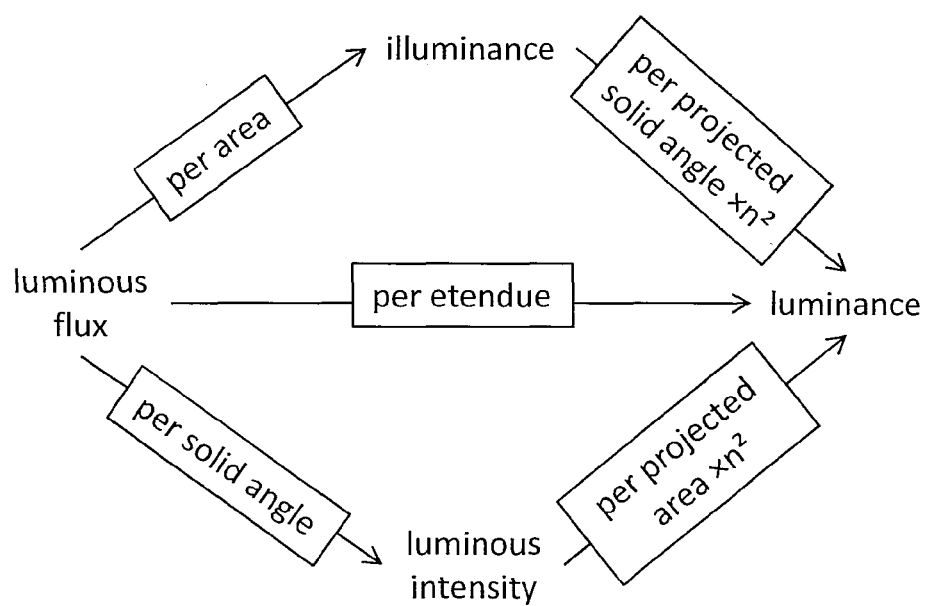

FIG. 7 illustrates the correlation of the radiometric (upper image) and photometric quantities (lower image) introduced to a ray data set according to the invention. The radiant flux differs from the luminous flux (lower image), in that the luminous flux is adjusted to reflect the varying sensitivity of the human eye to different wavelengths of light. Both quantities are referred to as "light power" in the context of this application. For a definition, reference is for example made to "Field Guide to Illumination" by Angelo V. Arecchi et al, SPIE Press 2007.

The characterization of a ray according to the invention is explained with the radiometric quantities and results analogously for the photometric quantities. The radiance is a radiant flux per etendue and consequently contains information on both. By assigning now a radiance and radiant flux or etendue, the ray is fully characterized (besides the coordinates). Likewise, the ray can also be characterized by assigning an illuminance (or luminous intensity) and providing values for the area element (solid angle) and the projected solid angle (projected area), as the radiance and radiant flux can be derived again.

Figure 8:
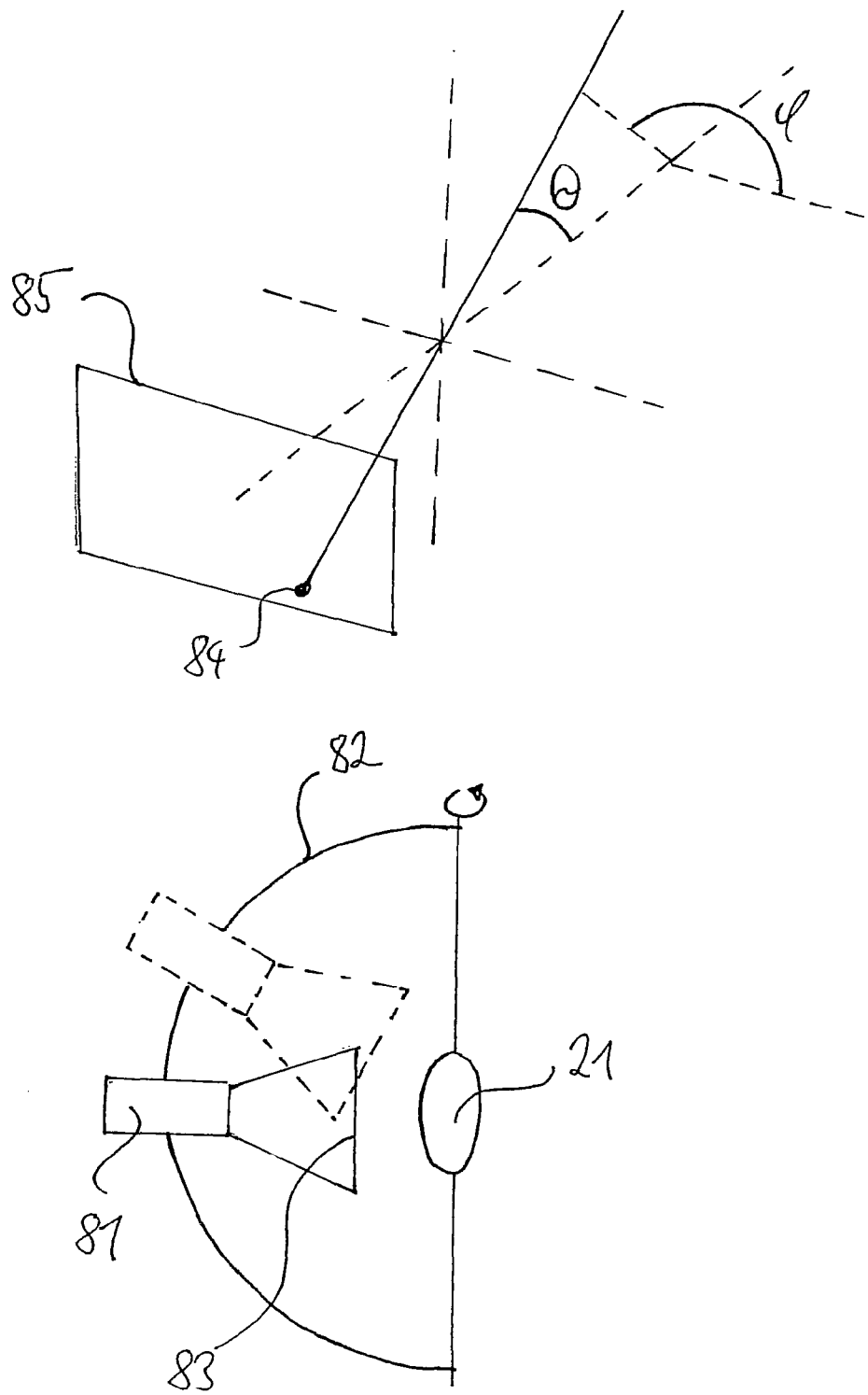
FIG. 8 illustrates a luminance measurement with a camera.

FIG. 8 illustrates a luminance measurement, wherein a camera 81 is pivotally mounted in a goniometer 82 and images a reference surface 83 around the light source 21, which does not necessarily coincide with a surface of the light source. Therein, the measuring camera 81 is moved in the goniometer 82 on a spherical surface around the light source 21 and captures images in a specific angular grid.

The images taken together result in a 4-dimensional data field. The upper representation in FIG. 7 illustrates that the picture coordinates 84 taken with a CCD array 85 can be transferred to spatial directions, if the properties of the optical imaging are known. Together with the information on the respective camera positions in the angular grid, a luminance in dependence of a position on the reference surface and a direction from the surface is obtained.

From this data, a ray data set according to this invention can be obtained by splitting the source etendue into small pieces of known volume (sub-volumes) and selecting a point from the sub-volume, which is 4-dimensional such that the point is a ray. Then, the luminance of this ray can obtained by an interpolation of the camera information and be assigned to the ray. The respective luminous flux can be derived from multiplying the luminance with the sub-volume. The values are then assigned to the respective ray, which is one of a plurality of rays comprised in a ray data set according to the invention.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A method of making an illumination device comprising:
obtaining information on light power and etendue of light rays emitted by a light source the information comprising a plurality of imaging optical measurements;
deriving, from the information obtained, an etendue sum for the light rays, wherein the etendue sum is derived by respectively adding an etendue value of a light ray, whose light power per etendue exceeds that of at least 80% of those light rays not having yet been added to said etendue sum; and
selecting an optical system so that the optical system the etendue sum exceeds an etendue of the optical system by no more than 20%.

2. The method of claim 1, wherein information on said light power and said etendue is at least one of a radiant flux together with a radiance, and a luminous flux together with a luminance.

3. The method of claim 1, wherein information on said light power and said etendue is obtained by physically modeling said light source.

4. The method of claim 1, wherein information on said light power and said etendue is obtained by an optical measurement device at a plurality of positions about the light source.

5. The method of claim 1, wherein a marginal light power per etendue is obtained by sorting said light rays with respect to light power per etendue and comparing an etendue sum with an etendue of an optical system.

6. The method of claim 1, wherein a setup of said light source and said optical system is derived in an optimization process, which maximizes a number of light rays being considered in the etendue sum.

7. The method of claim 6, wherein said optimization process considers only light rays which have a light power per etendue smaller than at least 20% of other light rays considered in the etendue sum.

8. A non-transitory computer program product comprising one or more stored sequence of instructions that is accessible to a processor and which, when executed by the processor, causes the processor to carry out the steps of the method according to claim 1.

9. The method of claim 1, wherein the optical system comprises one of a lens, a reflector, and a projection plane.

* * * * *